United States Patent
Park et al.

(10) Patent No.: US 12,236,849 B2
(45) Date of Patent: Feb. 25, 2025

(54) DISPLAY DEVICE

(71) Applicant: Samsung Display Co., LTD., Yongin-si (KR)

(72) Inventors: Junhyun Park, Suwon-si (KR); Youngwan Seo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/323,336

(22) Filed: May 24, 2023

(65) Prior Publication Data

US 2024/0029637 A1    Jan. 25, 2024

(30) Foreign Application Priority Data

Jul. 22, 2022   (KR) ........................ 10-2022-0091032

(51) Int. Cl.
*G09G 3/32* (2016.01)

(52) U.S. Cl.
CPC ....... *G09G 3/32* (2013.01); *G09G 2310/0267* (2013.01); *G09G 2310/0275* (2013.01); *G09G 2310/0278* (2013.01); *G09G 2330/06* (2013.01)

(58) Field of Classification Search
None
See application file for complete search history.

(56) References Cited

U.S. PATENT DOCUMENTS

| | | | | |
|---|---|---|---|---|
| 7,009,254 | B2* | 3/2006 | Nagasawa | G02F 1/136204 257/355 |
| 2004/0218322 | A1* | 11/2004 | Chen | H01L 27/0285 361/56 |
| 2008/0129674 | A1* | 6/2008 | Abe | G09G 3/20 345/92 |
| 2008/0174577 | A1* | 7/2008 | Fujita | G09G 3/3677 345/204 |
| 2009/0294163 | A1* | 12/2009 | Yamamoto | G09G 3/3696 174/261 |
| 2011/0075063 | A1* | 3/2011 | Tajiri | G09G 3/3651 349/42 |
| 2015/0091444 | A1* | 4/2015 | Ebisuno | H02H 9/044 315/125 |
| 2015/0160522 | A1* | 6/2015 | Wu | H02H 9/045 349/40 |
| 2021/0043621 | A1* | 2/2021 | Long | H01L 27/0248 |

(Continued)

FOREIGN PATENT DOCUMENTS

| | | |
|---|---|---|
| KR | 10-2015-0015608 | 2/2015 |
| KR | 10-1844529 | 4/2018 |

*Primary Examiner* — Dorothy Harris
(74) *Attorney, Agent, or Firm* — Lewis Roca Rothgerber Christie LLP

(57) ABSTRACT

A display device comprises a gate driver configured to receive a first gate driving voltage, configured to receive a second gate driving voltage that is greater than the first gate driving voltage, and configured to transmit a gate signal to a pixel, a data driver configured to transmit a data voltage to the pixel, and an electrostatic protection circuit configured to receive the first gate driving voltage and the data voltage, and including a first electrostatic diode including a first gate terminal connected to the first gate driving voltage, a first terminal connected to the first gate driving voltage, a second terminal connected to the data voltage, and a first lower gate terminal connected to a lower bias voltage.

8 Claims, 12 Drawing Sheets

(56) References Cited

U.S. PATENT DOCUMENTS

2021/0082963 A1* 3/2021 Long .................. G09G 3/20
2021/0225290 A1* 7/2021 Kang ................ G09G 3/3275
2022/0415243 A1* 12/2022 Li .................... G09G 3/2096

* cited by examiner

DISPLAY DEVICE

CROSS-REFERENCE TO RELATED APPLICATION

This application claims priority to, and the benefit of, Korean Patent Application No. 10-2022-0091032, filed on Jul. 22, 2022 in the Korean Intellectual Property Office, the content of which, in its entirety, is herein incorporated by reference.

BACKGROUND

1. Field

Embodiments of the present disclosure relate to a display device.

2. Description of the Related Art

A display device includes a plurality of insulating layers and a plurality of metal layers formed between the insulating layers. In order to form the insulating layers and the metal layers, the display device is manufactured through various processes. In the process of manufacturing the display device, static electricity may be generated due to factors such as friction and array test. To reduce or prevent the likelihood of defects due to static electricity, an electrostatic protection circuit is provided in a non-display area of the display device.

SUMMARY

Embodiments provide a display device.

A display device according to one or more embodiments may include a gate driver configured to receive a first gate driving voltage, configured to receive a second gate driving voltage that is greater than the first gate driving voltage, and configured to transmit a gate signal to a pixel, a data driver configured to transmit a data voltage to the pixel, and an electrostatic protection circuit configured to receive the first gate driving voltage and the data voltage, and including a first electrostatic diode including a first gate terminal connected to the first gate driving voltage, a first terminal connected to the first gate driving voltage, a second terminal connected to the data voltage, and a first lower gate terminal connected to a lower bias voltage.

The lower bias voltage may include a constant voltage having a negative polarity.

The lower bias voltage may include the first gate driving voltage.

The electrostatic protection circuit may be further configured to receive the second gate driving voltage, and may further include a second electrostatic diode including a second gate terminal connected to the data voltage, a third terminal connected to the data voltage, a fourth terminal connected to the second gate driving voltage, and a second lower gate terminal connected to the lower bias voltage.

The second terminal and the third terminal may be directly connected to each other.

The lower bias voltage may include a constant voltage having a negative polarity.

The lower bias voltage may include the first gate driving voltage.

The electrostatic protection circuit may be positioned between the pixel and the data driver.

A display device according to one or more other embodiments may include a gate driver configured to receive a first gate driving voltage, configured to receive a second gate driving voltage that is greater than the first gate driving voltage, and configured to transmit a gate signal to a pixel, a data driver configured to transmit a data voltage to the pixel, and an electrostatic protection circuit configured to receive the first gate driving voltage and the data voltage, and including a first electrostatic dual diode including a first gate terminal connected to the first gate driving voltage, a first terminal connected to the first gate driving voltage, and a second terminal connected to a first node, and a second electrostatic dual diode including a second gate terminal connected to the first node, a third terminal connected to the first node, and a fourth terminal connected to the data voltage.

The second terminal and the third terminal may be directly connected to each other.

The electrostatic protection circuit may further include a third electrostatic dual diode including a third gate terminal connected to the data voltage, a fifth terminal connected to the data voltage, and a sixth terminal connected to a second node.

The fourth terminal and the fifth terminal may be directly connected to each other.

The electrostatic protection circuit may be further configured to receive the second gate driving voltage, and may further include a fourth electrostatic dual diode including a fourth gate terminal connected to the second node, a seventh terminal connected to the second node, and an eighth terminal connected to the second gate driving voltage.

The sixth terminal and the seventh terminal may be directly connected to each other.

A display device according to still one or more other embodiments may include a gate driver configured to receive a first gate driving voltage, configured to receive a second gate driving voltage that is greater than the first gate driving voltage, and configured to transmit a gate signal to a pixel, a data driver configured to transmit a data voltage to the pixel, and an electrostatic protection circuit configured to receive the first gate driving voltage and the data voltage, and including a first electrostatic dual diode including a first gate terminal connected to the first gate driving voltage, a first terminal connected to the first gate driving voltage, and a second terminal connected to a first node, and a second electrostatic dual diode including a second gate terminal connected to the first gate driving voltage, a third terminal connected to the first node, and a fourth terminal connected to the data voltage.

The second terminal and the third terminal may be directly connected to each other.

The electrostatic protection circuit may further include a third electrostatic dual diode including a third gate terminal connected to the data voltage, a fifth terminal connected to the data voltage, and a sixth terminal connected to a second node.

The fourth terminal and the fifth terminal may be directly connected to each other.

The electrostatic protection circuit may be further configured to receive the second gate driving voltage, and may further include a fourth electrostatic dual diode including a fourth gate terminal connected to the data voltage, a seventh terminal connected to the second node, and an eighth terminal connected to the second gate driving voltage.

The sixth terminal and the seventh terminal may be directly connected to each other.

Therefore, the display device according to embodiments may include an electrostatic protection circuit, and the electrostatic protection circuit may include a first electrostatic diode and a second electrostatic diode. A first gate terminal of the first electrostatic diode may be connected to a first gate driving voltage, a first terminal may be connected to the first gate driving voltage, a second terminal may be connected to a data voltage, and a first lower gate terminal may be connected to a lower bias voltage. A second gate terminal of the second electrostatic diode may be connected to the data voltage, a third terminal may be connected to the data voltage, a fourth terminal may be connected to a second gate driving voltage, and a second lower gate terminal may be connected to the lower bias voltage.

The lower bias voltage may be a constant voltage having a negative polarity. Accordingly, current leakage by the electrostatic protection circuit may be reduced or prevented.

It is to be understood that both the foregoing general description and the following detailed description are examples, and are intended to provide further explanation of the claimed embodiments.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
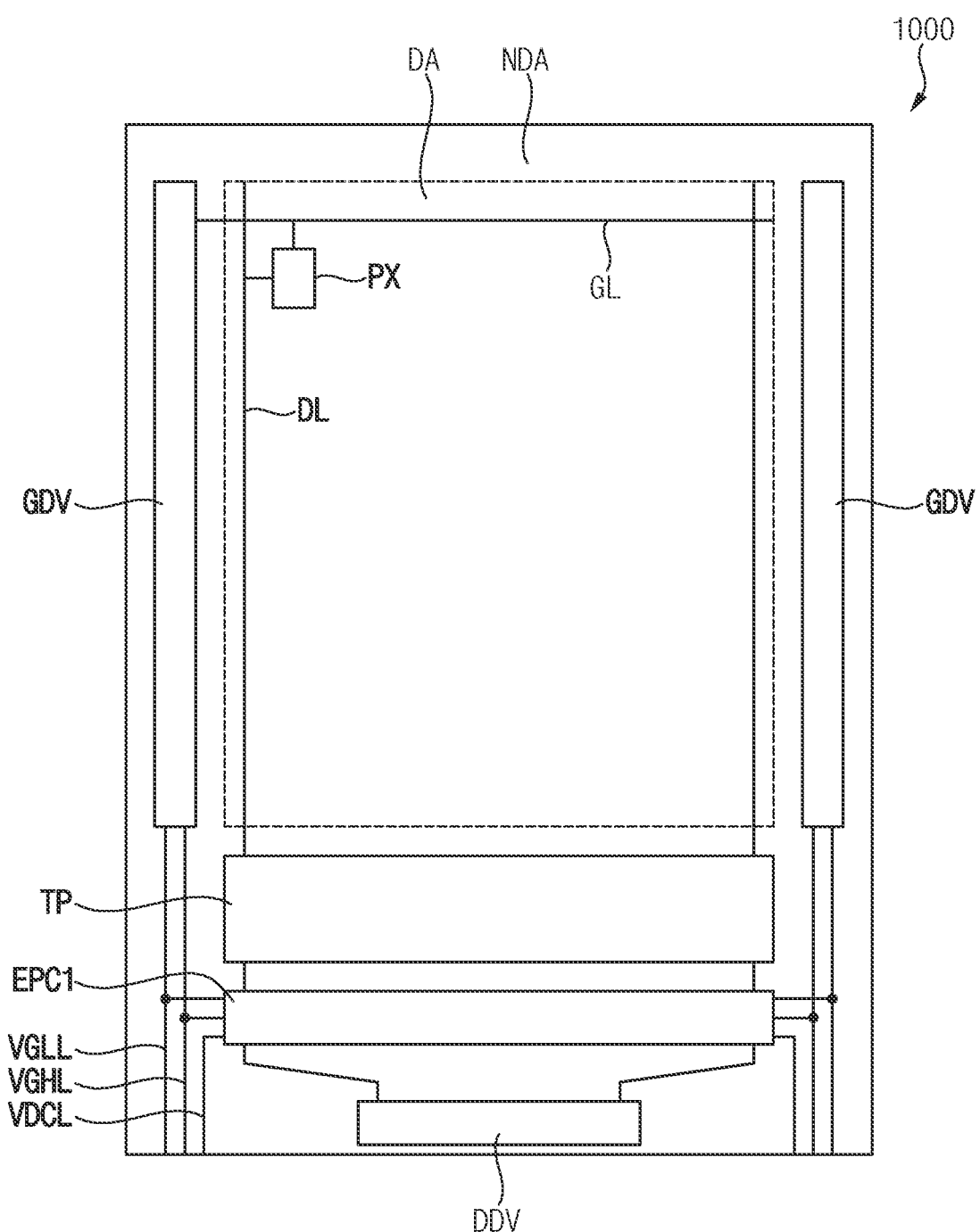
FIG. 1 is a plan view illustrating a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures.

It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
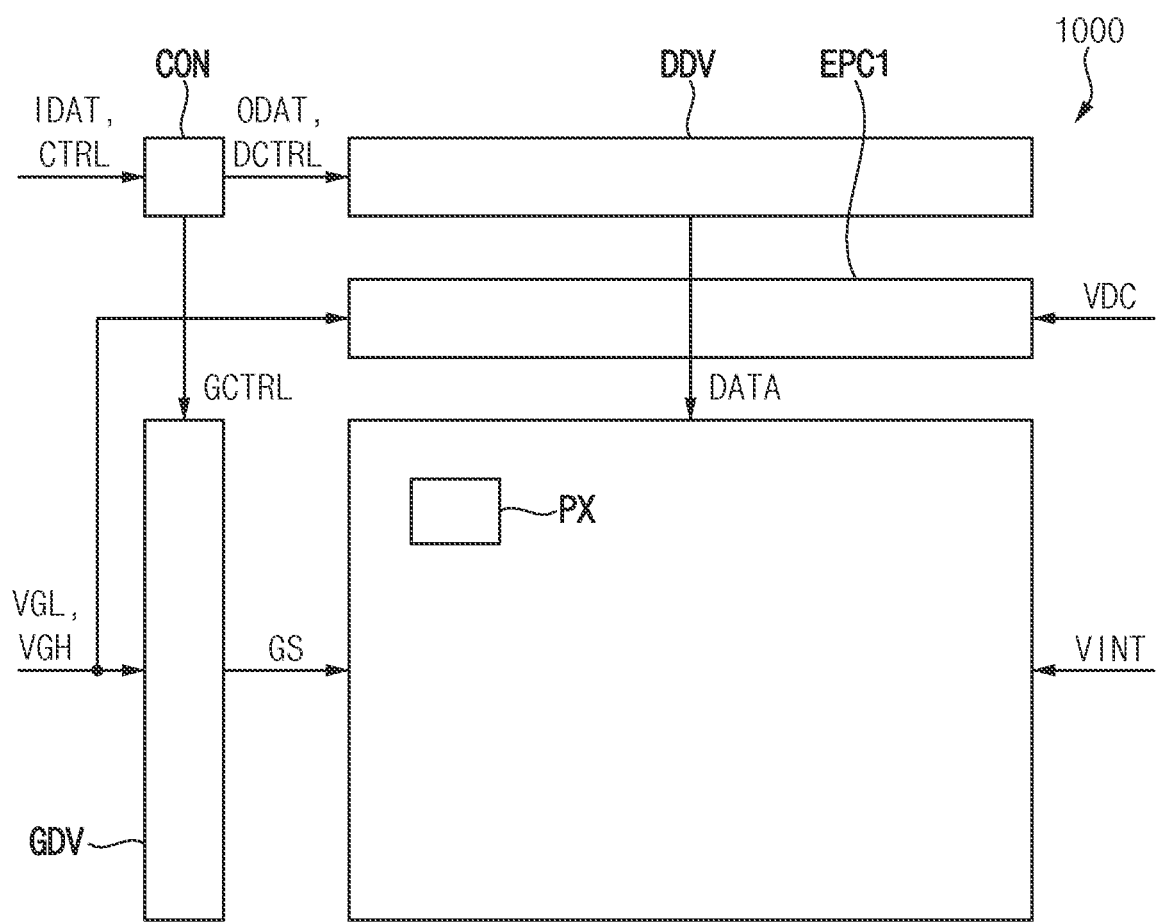
FIG. 2 is a block diagram illustrating the display device of FIG. 1.

FIG. 1 is a plan view illustrating a display device according to one or more embodiments, and FIG. 2 is a block diagram illustrating the display device of FIG. 1.

Referring to FIGS. 1 and 2, the display device 1000 according to one or more embodiments may be divided into a display area DA and a non-display area NDA. In one or more embodiments, the display area DA may have a rectangular shape, and the non-display area NDA may be positioned to surround the display area DA.

A pixel PX may be located in the display area DA. The pixel PX may emit light, and an image may be displayed in the display area DA.

A gate driver GDV, a data driver DDV, a test part TP, and an electrostatic protection circuit EPC1 may be located in the non-display area NDA.

The gate driver GDV may be connected to a first gate driving voltage line VGLL, a second gate driving voltage line VGHL, and a gate line GL. The gate line GL may be connected to the pixel PX, and the gate driver GDV may transmit a gate signal GS to the pixel PX.

The data driver DDV may be connected to the data line DL. The data line DL may be connected to the pixel PX, and the data driver DDV may transmit a data voltage DATA to the pixel PX.

The test part TP may be located between the display area DA and the electrostatic protection circuit EPC1. The test part TP may be connected to the data line DL and may perform an array test of the pixels PX.

In one or more embodiments, the electrostatic protection circuit EPC1 may be located between the test part TP and the data driver DDV. For example, the electrostatic protection circuit EPC1 may be connected to the first gate driving voltage line VGLL, the second gate driving voltage line VGHL, a lower bias voltage line VDCL, and the data line DL. The electrostatic protection circuit EPC1 may reduce or prevent the likelihood of defects due to static electricity flowing in the manufacturing process of the display device 1000.

FIG. 1 illustrates that the electrostatic protection circuit EPC1 is located adjacent to a lower end of the display area DA, but is not limited thereto. For example, the electrostatic protection circuit EPC1 may be located adjacent to an upper end, a left end, and/or a right end of the display area DA. Also, the display device 1000 may include at least two or more electrostatic protection circuits.

As illustrated in FIG. 2, the display device 1000 may include the data driver DDV, the gate driver GDV, the electrostatic protection circuit EPC1, and a controller CON.

The data driver DDV may generate the data voltage DATA based on the output image data ODAT and the data control signal DCTRL. For example, the data driver DDV may generate the data voltage DATA corresponding to the output image data ODAT, and may output the data voltage DATA in response to the data control signal DCTRL. The output image data ODAT may be RGB data for an image displayed in the display area DA, and the data control signal DCTRL may include an output data enable signal, a horizontal start signal, and a load signal.

The gate driver GDV may generate the gate signal GS based on the first gate driving voltage VGL, the second gate driving voltage VGH, and a gate control signal GCTRL. For example, the gate driver GDV may generate the gate signal GS corresponding to the first gate driving voltage VGL and the second gate driving voltage VGH, and may output the gate signal GS in response to the gate control signal GCTRL.

In one or more embodiments, the first gate driving voltage VGL and the second gate driving voltage VGH may be constant voltage. For example, the first gate driving voltage VGL may be a constant voltage having a negative polarity, and the second gate driving voltage VGH may be a constant voltage having a positive polarity. For example, the second gate driving voltage VGH may be greater than the first gate driving voltage VGL, and the first gate driving voltage VGL may be approximately −8V, and the second gate driving voltage VGH may be approximately 8V.

The control unit CON (e.g., timing controller T-CON) may receive input image data IDAT and the control signal CTRL from an external host processor (e.g., a graphics processing unit (GPU)). For example, the input image data IDAT may be RGB data including red image data, green image data, and blue image data. The controller CON may generate the data control signal DCTRL, the output image data ODAT, and the gate control signal GCTRL based on the input image data IDAT and the control signal CTRL.

The electrostatic protection circuit EPC1 may receive the first gate driving voltage VGL, the second gate driving voltage VGH, the data voltage DATA, and a lower bias voltage VDC. In the manufacturing process of the display device 1000, the electrostatic protection circuit EPC1 may reduce or prevent the likelihood of a defect due to static electricity based on the first gate driving voltage VGL and the second gate driving voltage VGH. Also, because the lower bias voltage VDC is provided to the electrostatic protection circuit EPC1 after the manufacturing process of the display device 1000 is completed, current leakage by the electrostatic protection circuit EPC1 may be reduced or prevented. For example, the electrostatic protection circuit EPC1 may include at least one electrostatic diode.

Figure 3:
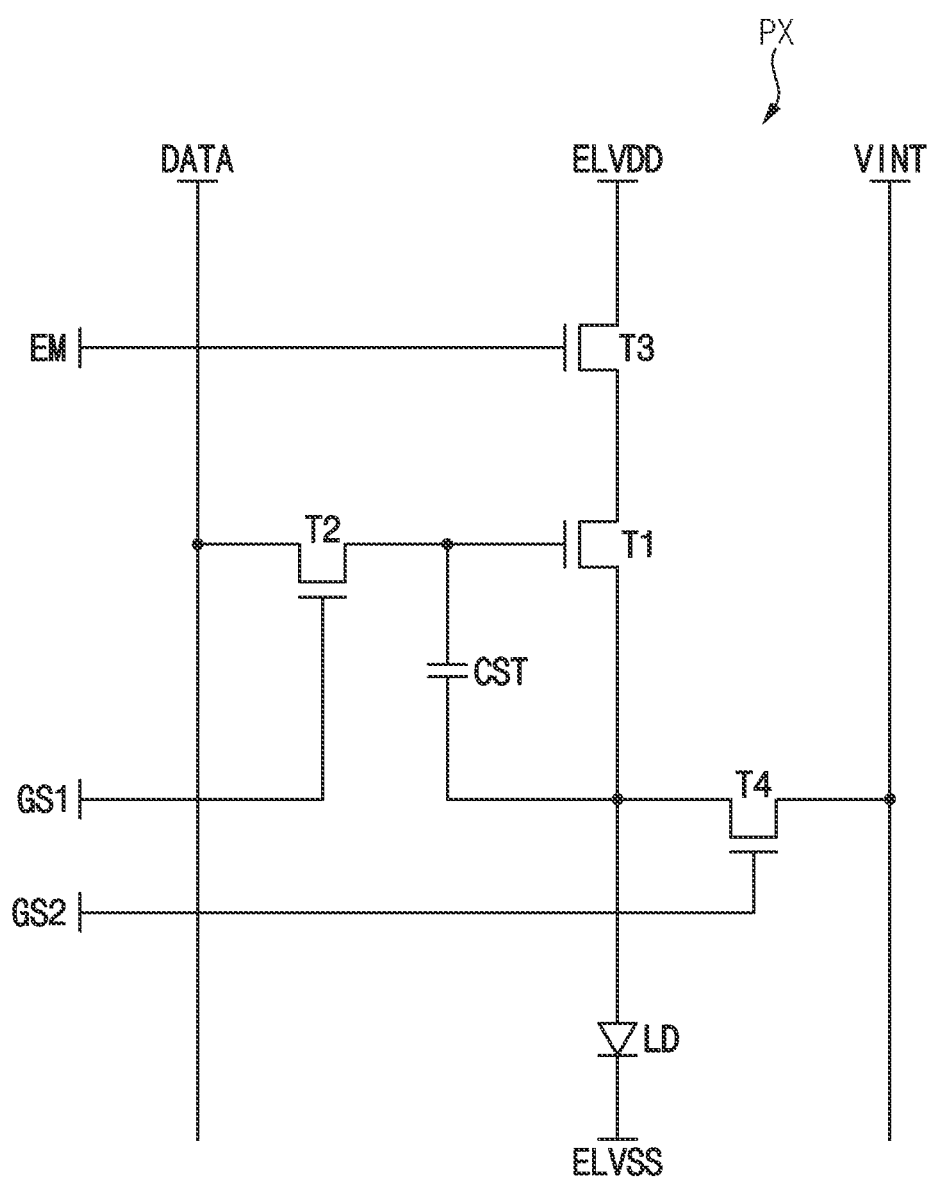
FIG. 3 is a circuit diagram illustrating a pixel included in the display device of FIG. 1.

FIG. 3 is a circuit diagram illustrating a pixel included in the display device of FIG. 1.

Referring to FIG. 3, the pixel PX may include a first transistor T1, a second transistor T2, a third transistor T3, a fourth transistor T4, a capacitor CST, and a light emitting diode LD.

The first transistor T1 may include a gate terminal, a first terminal, and a second terminal. The gate terminal may be connected to the second transistor T2. The first terminal may be connected to a high-power voltage ELVDD. The second terminal may be connected to the light emitting diode LD. The first transistor T1 may generate a driving current based on the high-power voltage ELVDD and the data voltage DATA.

The second transistor T2 may include a gate terminal, a first terminal, and a second terminal. The gate terminal may be connected to the first gate signal GS1. The first terminal may be connected to the data voltage DATA. The second terminal may be connected to the first transistor T1. The second transistor T2 may transmit the data voltage DATA in response to the first gate signal GS1.

The third transistor T3 may include a gate terminal, a first terminal, and a second terminal. The gate terminal may be connected to the emission control signal EM. The first terminal may be connected to the high-power voltage ELVDD. The second terminal may be connected to the first transistor T1. The third transistor T3 may transmit the high-power voltage ELVDD in response to the emission control signal EM.

The fourth transistor T4 may include a gate terminal, a first terminal, and a second terminal. The gate terminal may be connected to a second gate signal GS2. The first terminal may be connected to the light emitting diode LD. The second terminal may be connected to an initialization voltage VINT. The fourth transistor T4 may transmit the initialization voltage VINT in response to the second gate signal GS2.

The capacitor CST may include a first terminal and a second terminal. The first terminal may be connected to the gate terminal of the first transistor T1. The second terminal may be connected to the second terminal of the first transistor T1.

The light emitting diode LD may include a first terminal and a second terminal. The first terminal may be connected to the first transistor T1. The second terminal may be connected to a low-power voltage ELVSS. The light emitting diode LD may emit light based on the driving current.

Figure 4:
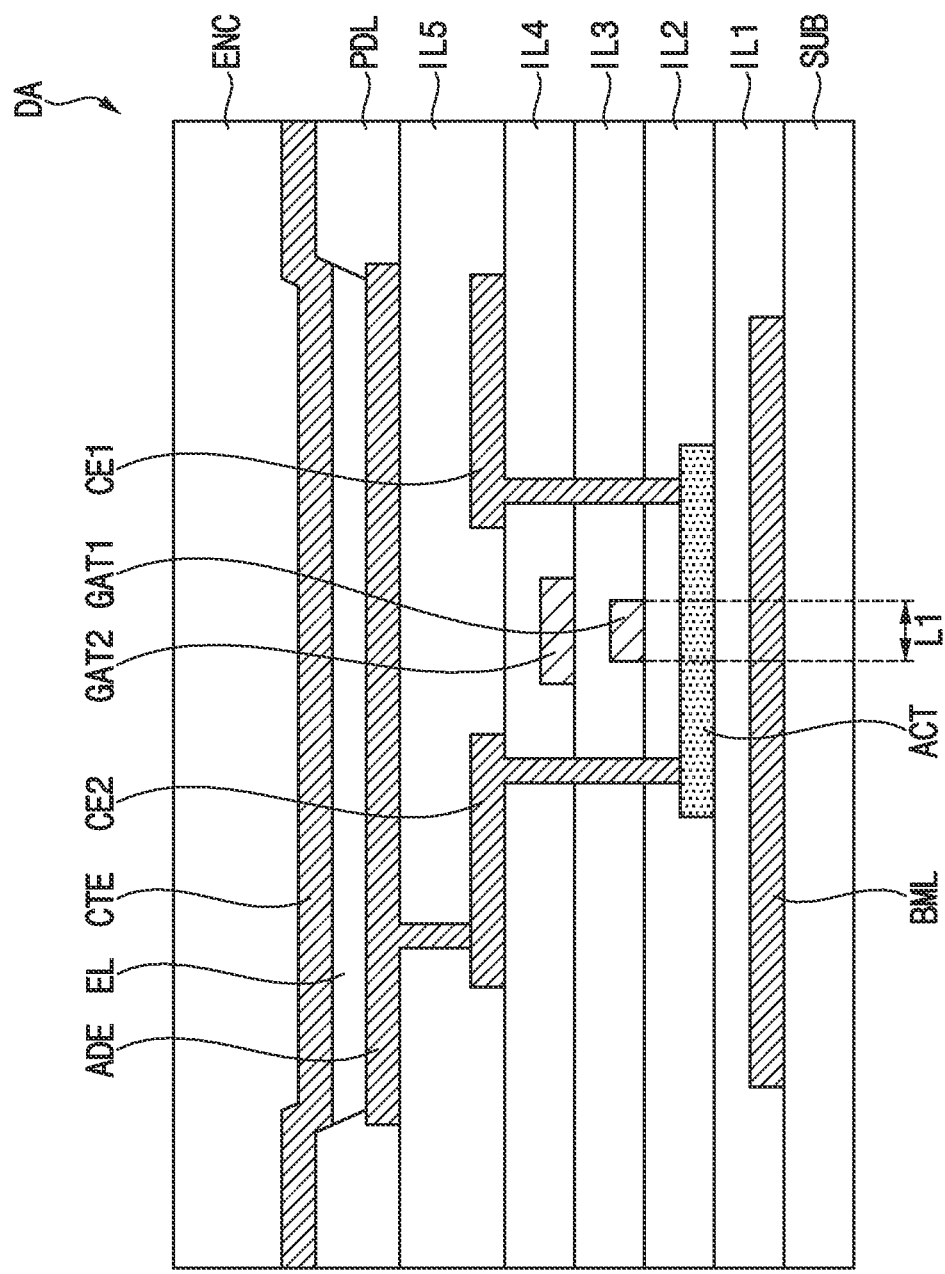
FIG. 4 is a cross-sectional view illustrating the display device of FIG. 1.

FIG. 4 is a cross-sectional view illustrating the display device of FIG. 1.

Referring to FIG. 4, the display device 1000 may include a substrate SUB, a back metal layer BML, a first insulating layer IL1, an active pattern ACT, a second insulating layer IL2, a first gate electrode GAT1, a third insulating layer IL3, a second gate electrode GAT2, a fourth insulating layer IL4, a first connecting electrode CE1, a second connecting electrode CE2, a fifth insulating layer IL5, a first electrode ADE, a pixel defining layer PDL, an emission layer EL, a second electrode CTE, and an encapsulation layer ENC.

The substrate SUB may include a transparent or opaque material. In one or more embodiments, examples of the material that can be used as the substrate SUB may include glass, quartz, plastic, and the like. These may be used alone or in combination with each other.

In one or more embodiments, the back metal layer BML may be located on the substrate SUB. In one or more embodiments, the back metal layer BML may be formed of a metal, an alloy, a conductive metal oxide, a transparent conductive material, or the like. Examples of the material that can be used as the back metal layer BML may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. Also, the back metal layer BML may be formed of a single layer or a multilayer.

The first insulating layer IL1 may be located on the back metal layer BML. In one or more embodiments, the first insulating layer IL1 may be formed of an insulating material. Examples of the insulating material that can be used as the first insulating layer IL1 may include silicon oxide, silicon nitride, silicon oxynitride, and the like. These may be used alone or in combination with each other. Also, the first insulating layer IL1 may be formed of a single layer or a multilayer.

The active pattern ACT may be located on the first insulating layer IL1. In one or more embodiments, the active pattern ACT may be formed of an oxide semiconductor material or a silicon semiconductor material. Examples of the oxide semiconductor material that can be used as the active pattern ACT may include IGZO (InGaZnO) and ITZO (InSnZnO). In addition, the oxide semiconductor material may further include indium (In), gallium (Ga), tin (Sn), zirconium (Zr), vanadium (V), hafnium (Hf), cadmium (Cd), germanium (Ge), chromium (Cr)), titanium (Ti), and zinc (Zn). These may be used alone or in combination with each other. Examples of the silicon semiconductor material that can be used as the active pattern ACT may include amorphous silicon, polycrystalline silicon, or the like.

The second insulating layer IL2 may be located on the active pattern ACT. In one or more embodiments, the second insulating layer IL2 may be formed of an insulating material. Examples of the insulating material that can be used as the second insulating layer IL2 may include silicon oxide, silicon nitride, silicon oxynitride, and the like. These may be used alone or in combination with each other. Also, the second insulating layer IL2 may be formed of a single layer or a multilayer.

The first gate electrode GAT1 may be located on the second insulating layer IL2. In one or more embodiments, the first gate electrode GAT1 may be formed of a metal, an alloy, a conductive metal oxide, a transparent conductive material, or the like. Examples of the material that can be used as the first gate electrode GAT1 may include silver (Ag), silver-containing alloy, molybdenum (Mo), molybdenum-containing alloy, aluminum (Al), and aluminum. alloy, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. Also, the first gate electrode GAT1 may be formed of a single layer or a multilayer.

In one or more embodiments, the active pattern ACT may overlap the first gate electrode GAT1 by a first overlapping length L1. For example, the first overlapping length L1 may be set in consideration of characteristics of a transistor.

The third insulating layer IL3 may be located on the first gate electrode GAT1. In one or more embodiments, the third insulating layer IL3 may be formed of an insulating material. Examples of the insulating material that can be used as the third insulating layer IL3 may include silicon oxide, silicon nitride, silicon oxynitride, and the like. These may be used alone or in combination with each other. Also, the third insulating layer IL3 may be formed of a single layer or a multilayer.

The second gate electrode GAT2 may be located on the third insulating layer IL3. In one or more embodiments, the second gate electrode GAT2 may be formed of a metal, an alloy, a conductive metal oxide, a transparent conductive material, or the like. Examples of the material that can be used as the second gate electrode GAT2 may include silver (Ag), silver-containing alloy, molybdenum (Mo), molybdenum-containing alloy, aluminum (Al), and aluminum. alloy, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. Also, the second gate electrode GAT2 may be formed of a single layer or a multilayer.

The fourth insulating layer IL4 may be located on the second gate electrode GAT2. In one or more embodiments, the fourth insulating layer IL4 may be formed of an insulating material. Examples of the insulating material that can be used as the fourth insulating layer IL4 may include silicon oxide, silicon nitride, silicon oxynitride, and the like. These may be used alone or in combination with each other. In addition, the fourth insulating layer IL4 may be formed of a single layer or a multilayer.

The first connecting electrode CE1 and the second connecting electrode CE2 may be located on the fourth insulating layer IL4. The first connecting electrode CE1 and the second connecting electrode CE2 may be formed together (e.g., during a same process), and may include the same material. The first connecting electrode CE1 and the second connecting electrode CE2 may contact the active pattern ACT.

In one or more embodiments, the first connecting electrode CE1 and the second connecting electrode CE2 may be formed of a metal, an alloy, a conductive metal oxide, a transparent conductive material, or the like. Examples of materials that can be used as the first connecting electrode CE1 and the second connecting electrode CE2 may include silver (Ag), an alloy containing silver, molybdenum (Mo), an alloy containing molybdenum, aluminum (Al), alloys containing aluminum, aluminum nitride (AlN), tungsten (W), tungsten nitride (WN), copper (Cu), nickel (Ni), chromium (Cr), chromium nitride (CrN), Titanium (Ti), tantalum (Ta), platinum (Pt), scandium (Sc), indium tin oxide (ITO), indium zinc oxide (IZO), and the like may be included. These may be used alone or in combination with each other. In addition, the first connecting electrode CE1 and the second connecting electrode CE2 may be formed of a single layer or a multilayer structure.

The fifth insulating layer IL5 may be located on the first and second connecting electrodes CE1 and CE2. In one or more embodiments, the fifth insulating layer IL5 may be formed of an organic insulating material and/or an inorganic insulating material. Examples of the organic insulating material that can be used as the fifth insulating layer IL5 may include photoresist, polyacrylic resin, polyimide resin, acrylic resin, and the like. Examples of the inorganic insulating material that can be used as the fifth insulating layer IL5 may include silicon oxide, silicon nitride, silicon oxynitride, and the like. These may be used alone or in combination with each other. Also, the fifth insulating layer IL5 may be formed of a single layer or a multilayer.

The first electrode ADE may be located on the fifth insulating layer IL5. In one or more embodiments, the first electrode ADE may be formed of a metal, an alloy, a conductive metal oxide, a transparent conductive material, or the like. Examples of materials that can be used as the first electrode ADE may include silver (Ag), silver-containing alloys, molybdenum (Mo), molybdenum-containing alloys, aluminum (Al), and aluminum-containing alloys. Alloys, aluminum nitride (AlN), tungsten (W), tungsten nitride (WN), copper (Cu), nickel (Ni), chromium (Cr), chromium nitride (CrN), titanium (Ti), tantalum (Ta), Platinum (Pt), scandium (Sc), indium tin oxide (ITO), indium zinc oxide (IZO), and the like may be included. These may be used alone or in combination with each other. In addition, the first electrode ADE may be formed of a single layer or a multilayer.

The pixel defining layer PDL may be located on the fifth insulating layer IL5. An opening exposing the first electrode ADE may be formed in, or defined by, the pixel defining layer PDL.

The emission layer EL may be located in the opening on the first electrode ADE. The light emitting layer EL may emit light in response to the driving current.

The second electrode CTE may be located on the emission layer EL.

The encapsulation layer ENC may be located on the second electrode CTE. The encapsulation layer ENC may include at least one inorganic layer and at least one organic layer, and may reduce or prevent penetration of air and/or moisture.

Figure 5:
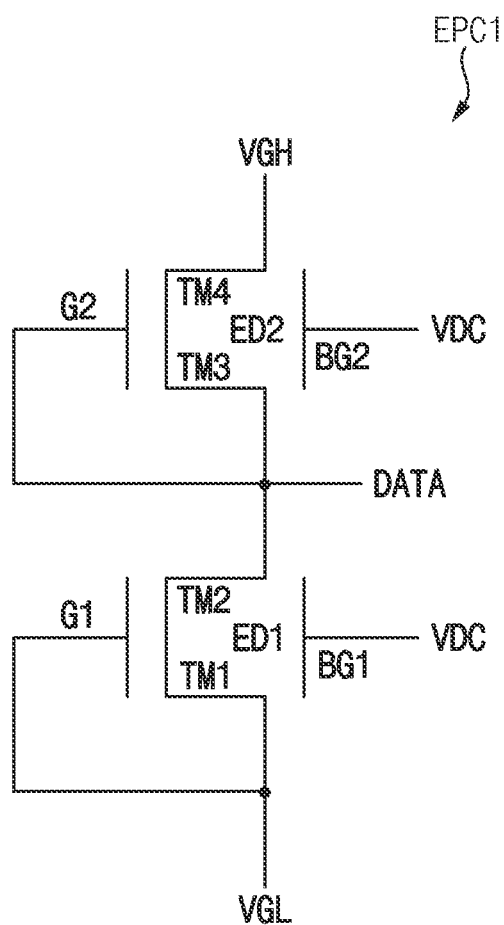
FIG. 5 is a circuit diagram illustrating an electrostatic protection circuit included in the display device of FIG. 1.
Figure 6:
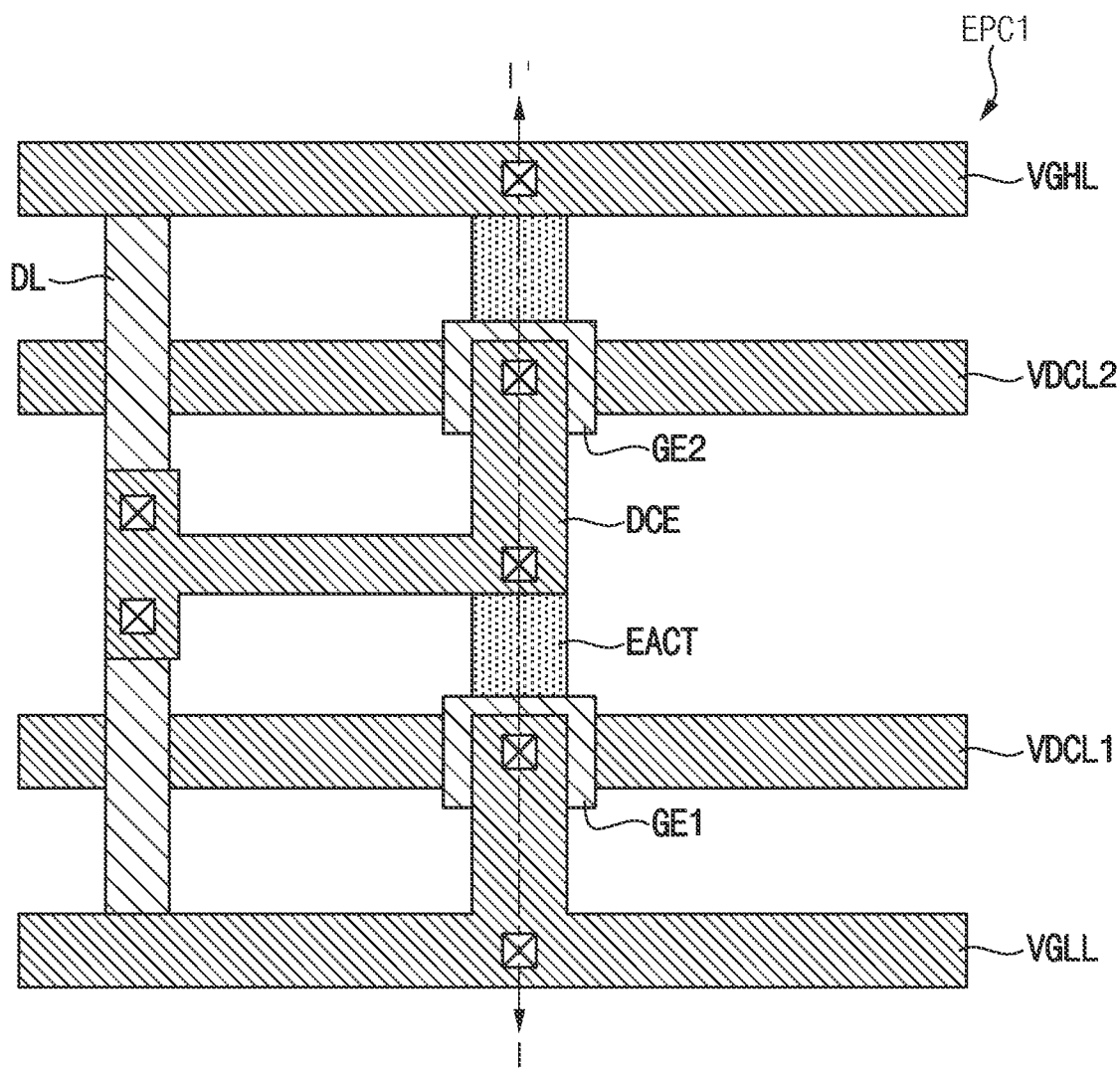
FIG. 6 is a plan view illustrating an electrostatic protection circuit of FIG. 5.
Figure 7:
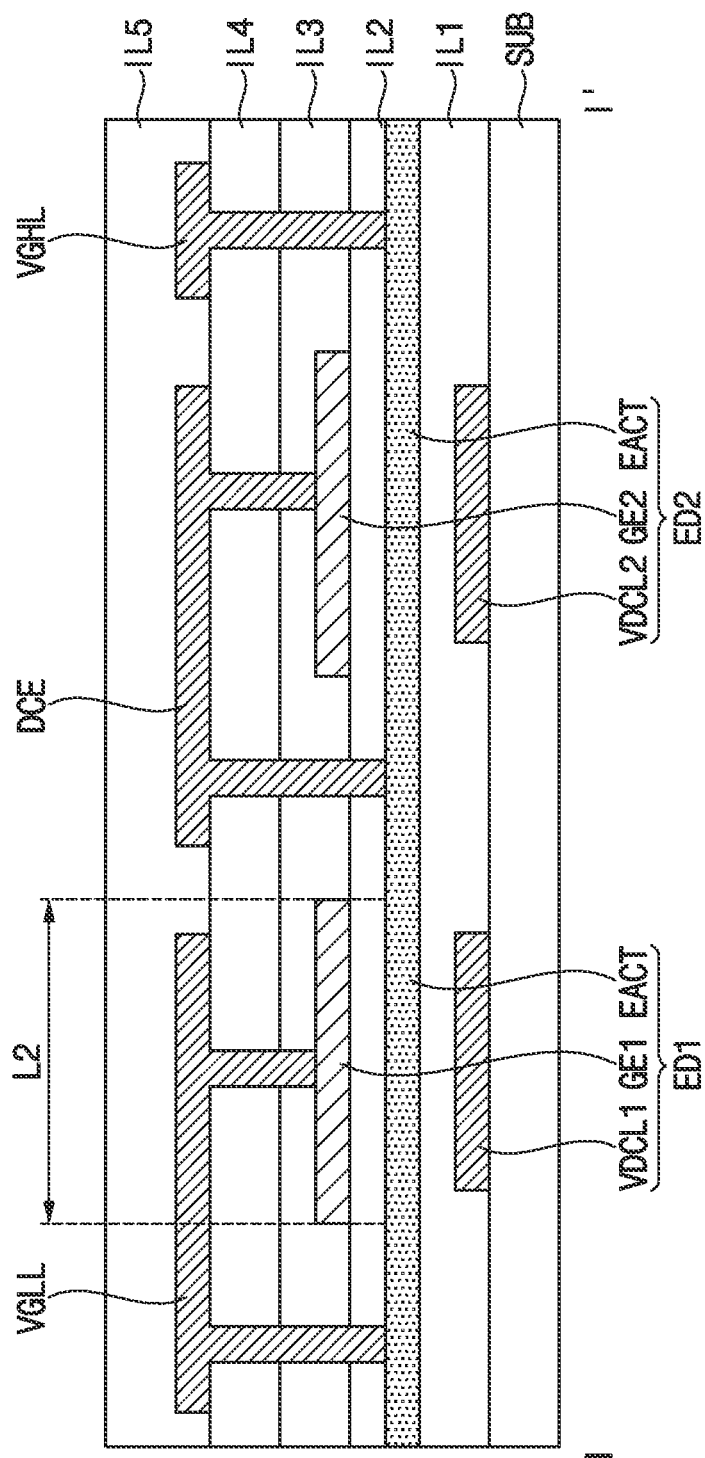
FIG. 7 is a cross-sectional view taken along the line I-I' of FIG. 6.

FIG. 5 is a circuit diagram illustrating an electrostatic protection circuit included in the display device of FIG. 1. FIG. 6 is a plan view illustrating an electrostatic protection circuit of FIG. 5. FIG. 7 is a cross-sectional view taken along the line I-I' of FIG. 6.

Referring to FIG. 5, the electrostatic protection circuit EPC1 may include a first electrostatic diode ED1 and a second electrostatic diode ED2.

The first electrostatic diode ED1 may include a first gate terminal G1, a first terminal TM1, a second terminal TM2, and a first lower gate terminal BG1. The first gate terminal G1 may be connected to the first gate driving voltage VGL. The first terminal TM1 may be connected to the first gate driving voltage VGL. The second terminal TM2 may be connected to the data voltage DATA. The first lower gate terminal BG1 may be connected to the lower bias voltage VDC.

The second electrostatic diode ED2 may include a second gate terminal G2, a third terminal TM3, a fourth terminal TM4, and a second lower gate terminal BG2. The second gate terminal G2 may be connected to the data voltage DATA. The third terminal TM3 may be connected to the data voltage DATA. The fourth terminal TM4 may be connected to the second gate driving voltage VGH. The second lower gate terminal BG2 may be connected to the lower bias voltage VDC.

In one or more embodiments, the second terminal TM2 and the third terminal TM3 may be directly connected to each other. Also, in one or more embodiments, the lower bias voltage VDC may be a constant voltage having a negative polarity. For example, the lower bias voltage VDC may be the same as the first gate driving voltage VGL to which an offset voltage (e.g., a predetermined offset voltage) is reflected.

Referring to FIGS. 6 and 7, the electrostatic protection circuit EPC1 may include a first lower bias voltage line VDCL1, a second lower bias voltage line VDCL2, an electrostatic protection active pattern EACT, a first electrostatic protection gate electrode GE1, and a second electrostatic protection gate electrode GE2.

In one or more embodiments, the first lower bias voltage line VDCL1, the electrostatic protection active pattern EACT, and the first electrostatic protection gate electrode GE1 may constitute the first electrostatic diode ED1. In addition, the second lower bias voltage line VDCL2, the electrostatic protection active pattern EACT, and the second electrostatic protection gate electrode GE2 may constitute the second electrostatic diode ED2.

The first lower bias voltage line VDCL1 and the second lower bias voltage line VDCL2 may be located on the substrate SUB. The first lower bias voltage line VDCL1 and the second lower bias voltage line VDCL2 may transmit the lower bias voltage VDC.

In one or more embodiments, the first lower bias voltage line VDCL1 and the second lower bias voltage line VDCL2 may be formed together. For example, the first lower bias voltage line VDCL1 and the second lower bias voltage line VDCL2 may be formed together with (e.g., formed in a same process as) the back metal layer BML, and may include the same material.

The electrostatic protection active pattern EACT may be located on the first insulating layer IL1. In one or more embodiments, the electrostatic protection active pattern EACT may be formed together with (e.g., formed in a same process as) the active pattern ACT, and may include the same material.

The first electrostatic protection gate electrode GE1 may be located on the second insulating layer IL2. In one or more embodiments, the first electrostatic protection gate electrode GE1 may be formed together with (e.g., formed in a same process as) the first gate electrode GAT1, and may include the same material.

In one or more embodiments, the electrostatic protection active pattern EACT may overlap the first electrostatic protection gate electrode GE1 by a second overlapping length L2. For example, the second overlapping length L2 may be set in consideration of the characteristics of the electrostatic diode. Also, the second overlapping length L2 may be greater than the first overlapping length L1. Accordingly, current leakage by the electrostatic protection circuit EPC1 may be further reduced or prevented.

The second electrostatic protection gate electrode GE2 may be located on the second insulating layer IL2. In one or more embodiments, the second electrostatic protection gate electrode GE2 may be formed together with (e.g., formed in a same process as) the first electrostatic protection gate electrode GE1, and may include the same material.

The first gate driving voltage line VGLL may be located on the fourth insulating layer IL4. In one or more embodiments, the first gate driving voltage line VGLL may be formed together with (e.g., formed in a same process as) the first and second connecting electrodes CE1 and CE2, and may include the same material.

In one or more embodiments, the first gate driving voltage line VGLL may transmit the first gate driving voltage VGL, and may be in contact with the electrostatic protection active pattern EACT and the first electrostatic protection gate electrode GE1. Accordingly, the first gate driving voltage line VGLL may transmit the first gate driving voltage VGL to the electrostatic protection active pattern EACT and the first electrostatic protection gate electrode GE1.

The data connecting electrode DCE may be located on the fourth insulating layer IL4. In one or more embodiments, the data connecting electrode DCE may be formed together with (e.g., formed in a same process as) the first gate driving voltage line VGLL, and may include the same material.

In one or more embodiments, the data connecting electrode DCE may be in contact with the data line DL, the electrostatic protection active pattern EACT, and the second electrostatic protection gate electrode GE2. Accordingly, the data connecting electrode DCE may transmit the data voltage DATA to the electrostatic protection active pattern EACT and to the second electrostatic protection gate electrode GE2.

The second gate driving voltage line VGHL may be located on the fourth insulating layer IL4. In one or more embodiments, the second gate driving voltage line VGHL may be formed together with (e.g., formed in a same process as) the first gate driving voltage line VGLL and the data connecting electrode DCE, and may include the same material.

In one or more embodiments, the second gate driving voltage line VGHL may transmit the second gate driving voltage VGH and may be in contact with the electrostatic protection active pattern EACT. Accordingly, the second gate driving voltage line VGHL may transmit the second gate driving voltage VGH to the electrostatic protection active pattern EACT.

The display device 1000 may include the electrostatic protection circuit EPC1, and the electrostatic protection circuit EPC1 may include the first electrostatic diode ED1 and the second electrostatic diode ED2. The first gate terminal G1 of the first electrostatic diode ED1 may be connected to the first gate driving voltage VGL, the first terminal TM1 may be connected to the first gate driving voltage VGL, the second terminal TM2 may be connected to the data voltage DATA, and the first lower gate terminal BG1 may be connected to the lower bias voltage VDC. The second gate terminal G2 of the second electrostatic diode ED2 may be connected to the data voltage DATA, the third terminal TM3 may be connected to the data voltage DATA, the fourth terminal TM4 may be connected to the second gate driving voltage VGH, and the second lower gate terminal BG2 may be connected to the lower bias voltage VDC.

In one or more embodiments. The lower bias voltage VDC may be a constant voltage having a negative polarity. Also, the second overlapping length L2 may be set to be greater than the first overlapping length L1. Accordingly, current leakage by the electrostatic protection circuit EPC1 may be reduced or prevented.

Figure 8:
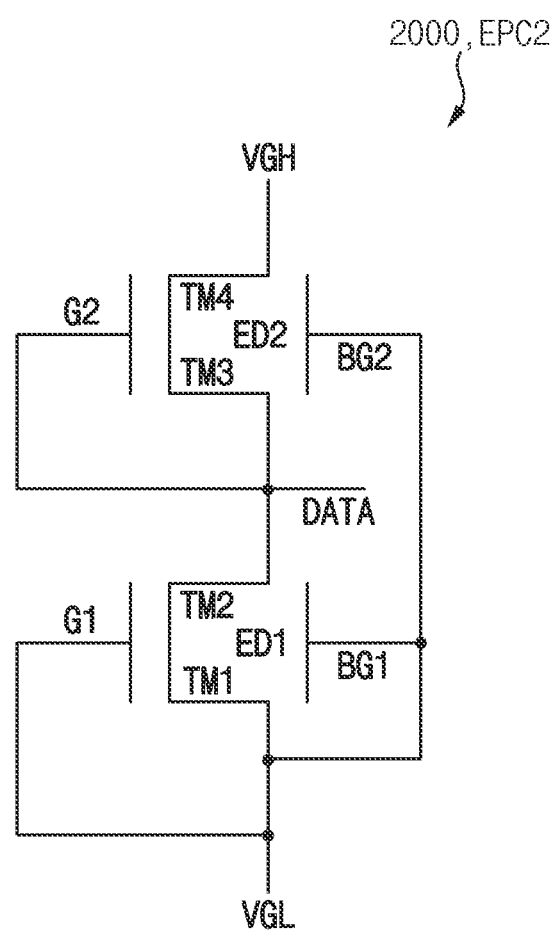
FIG. 8 is a circuit diagram illustrating an electrostatic protection circuit included in a display device according to one or more other embodiments.

FIG. 8 is a circuit diagram illustrating an electrostatic protection circuit included in a display device according to one or more other embodiments.

Referring to FIG. 8, a display device 2000 according to one or more other embodiments may include an electrostatic protection circuit EPC2. However, the display device 2000 may be substantially the same as the display device 1000, except for the electrostatic protection circuit EPC2.

The electrostatic protection circuit EPC2 may include a first electrostatic diode ED1 and a second electrostatic diode ED2.

The first electrostatic diode ED1 may include a first gate terminal G1, a first terminal TM1, a second terminal TM2, and a first lower gate terminal BG1. The first gate terminal G1 may be connected to the first gate driving voltage VGL. The first terminal TM1 may be connected to the first gate driving voltage VGL. The second terminal TM2 may be connected to the data voltage DATA. The first lower gate terminal BG1 may be connected to the first gate driving voltage VGL.

The second electrostatic diode ED2 may include a second gate terminal G2, a third terminal TM3, a fourth terminal TM4, and a second lower gate terminal BG2. The second gate terminal G2 may be connected to the data voltage DATA. The third terminal TM3 may be connected to the data voltage DATA. The fourth terminal TM4 may be connected to the second gate driving voltage VGH. The second lower gate terminal BG2 may be connected to the first gate driving voltage VGL.

In the display device 2000, as the first lower gate terminal BG1 and the second lower gate terminal BG2 are connected to the first gate driving voltage VGL, current leakage by the electrostatic protection circuit EPC1 may be reduced or prevented.

Figure 9:
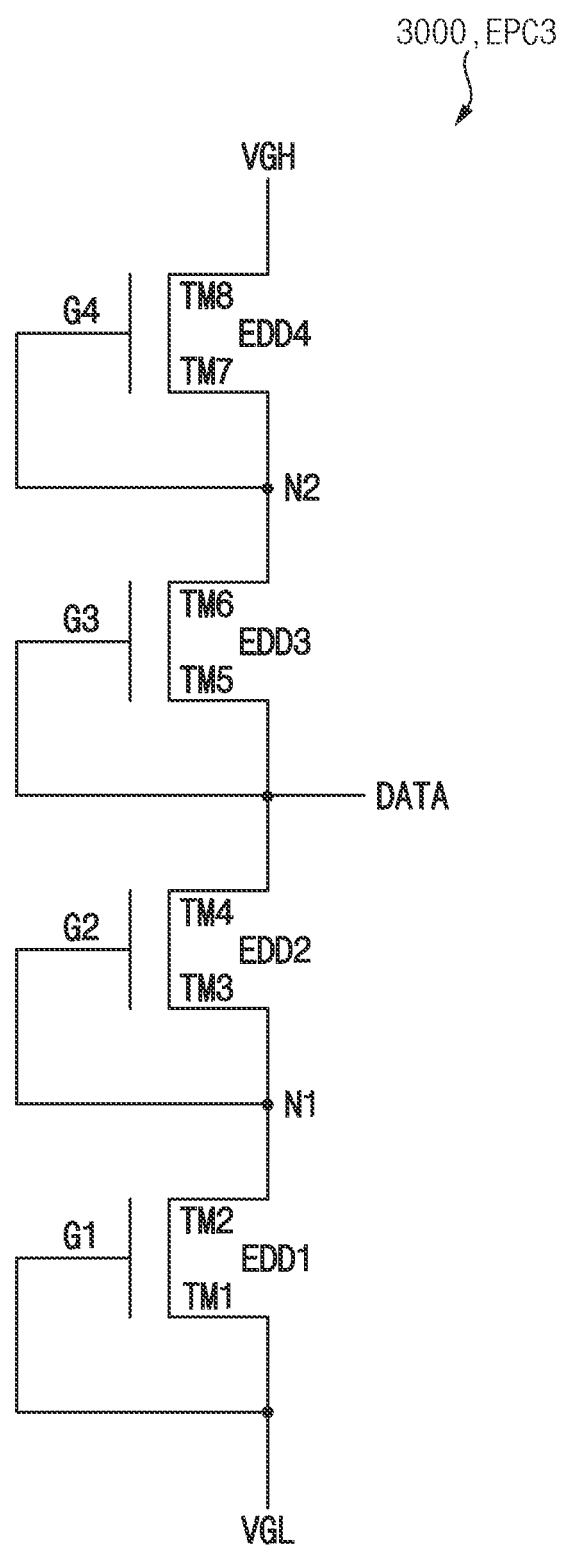
FIG. 9 is a circuit diagram illustrating an electrostatic protection circuit included in a display device according to still one or more other embodiments.

FIG. 9 is a circuit diagram illustrating an electrostatic protection circuit included in a display device according to still one or more other embodiments.

Referring to FIG. 9, a display device 3000 according to still one or more other embodiments may include an electrostatic protection circuit EPC3. However, the display device 3000 may be substantially the same as the display device 1000, except for the electrostatic protection circuit EPC3.

The electrostatic protection circuit EPC3 may include a first electrostatic dual diode EDD1, a second electrostatic dual diode EDD2, a third electrostatic dual diode EDD3, and a fourth electrostatic dual diode EDD4.

The first electrostatic dual diode EDD1 may include a first gate terminal G1, a first terminal TM1, and a second terminal TM2. The first gate terminal G1 may be connected to the first gate driving voltage VGL. The first terminal TM1 may be connected to the first gate driving voltage VGL. The second terminal TM2 may be connected to a first node N1.

The second electrostatic dual diode EDD2 may include a second gate terminal G2, a third terminal TM3, and a fourth terminal TM4. The second gate terminal G2 may be connected to the first node N1. The third terminal TM3 may be connected to the first node N1. The fourth terminal TM4 may be connected to the data voltage DATA.

The third electrostatic dual diode EDD3 may include a third gate terminal G3, a fifth terminal TM5, and a sixth terminal TM6. The third gate terminal G3 may be connected to the data voltage DATA. The fifth terminal TM5 may be connected to the data voltage DATA. The sixth terminal TM6 may be connected to a second node N2.

The fourth electrostatic dual diode EDD4 may include a fourth gate terminal G4, a seventh terminal TM7, and an eighth terminal TM8. The fourth gate terminal G4 may be connected to the second node N2. The seventh terminal TM7 may be connected to the second node N2. The eighth terminal TM8 may be connected to the second gate driving voltage VGH.

In one or more embodiments, the second terminal TM2 and the third terminal TM3 may be directly connected to each other, the fourth terminal TM4 and the fifth terminal TM5 may be directly connected to each other, and the sixth terminal TM6 and the seventh terminal TM7 may be directly connected to each other.

Figure 10:
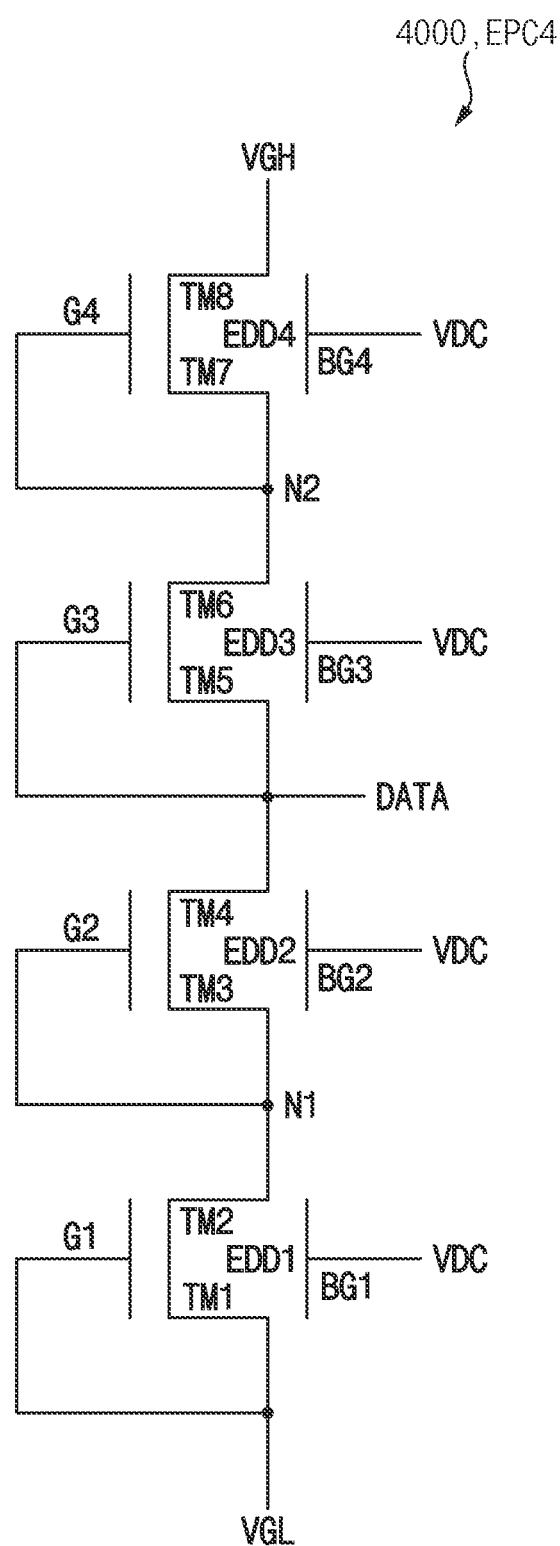
FIG. 10 is a circuit diagram illustrating an electrostatic protection circuit included in a display device according to still one or more other embodiments.

FIG. 10 is a circuit diagram illustrating an electrostatic protection circuit included in a display device according to still one or more other embodiments.

Referring to FIG. 10, a display device 4000 according to still one or more other embodiments may include an electrostatic protection circuit EPC4. However, the display device 4000 may be substantially the same as the display device 1000, except for the electrostatic protection circuit EPC4.

The electrostatic protection circuit EPC4 may include a first electrostatic dual diode EDD1, a second electrostatic dual diode EDD2, a third electrostatic dual diode EDD3, and a fourth electrostatic dual diode EDD4.

The first electrostatic dual diode EDD1 may include a first gate terminal G1, a first terminal TM1, a second terminal TM2, and a first lower gate terminal BG1. The first gate terminal G1 may be connected to the first gate driving voltage VGL. The first terminal TM1 may be connected to the first gate driving voltage VGL. The second terminal TM2 may be connected to a first node N1. The first lower gate terminal BG1 may be connected to the lower bias voltage VDC.

The second electrostatic dual diode EDD2 may include a second gate terminal G2, a third terminal TM3, a fourth terminal TM4, and a second lower gate terminal BG2. The second gate terminal G2 may be connected to the first node N1. The third terminal TM3 may be connected to the first node N1. The fourth terminal TM4 may be connected to the data voltage DATA. The second lower gate terminal BG2 may be connected to the lower bias voltage VDC.

The third electrostatic dual diode EDD3 may include a third gate terminal G3, a fifth terminal TM5, a sixth terminal TM6, and a third lower gate terminal BG3. The third gate terminal G3 may be connected to the data voltage DATA. The fifth terminal TM5 may be connected to the data voltage DATA. The sixth terminal TM6 may be connected to the second node N2. The third lower gate terminal BG3 may be connected to the lower bias voltage VDC.

The fourth electrostatic dual diode EDD4 may include a fourth gate terminal G4, a seventh terminal TM7, an eighth terminal TM8, and a fourth lower gate terminal BG4. The fourth gate terminal G4 may be connected to the second node N2. The seventh terminal TM7 may be connected to the second node N2. The eighth terminal TM8 may be connected to a second gate driving voltage VGH. The fourth lower gate terminal BG4 may be connected to the lower bias voltage VDC.

In one or more embodiments, the second terminal TM2 and the third terminal TM3 may be directly connected to each other, the fourth terminal TM4 and the fifth terminal TM5 may be directly connected to each other, and the sixth terminal TM6 and the seventh terminal TM7 may be directly connected to each other.

In the display device 4000, as the first and second electrostatic dual diodes EDD1, EDD2 are implemented as dual (e.g., in tandem), the third and fourth electrostatic dual diodes EDD3, EDD4 are implemented as dual, and the lower bias voltage VDC, which is a constant voltage having a negative polarity is provided to the lower gate electrode, current leakage by the electrostatic protection circuit EPC4 may be reduced or prevented.

Figure 11:
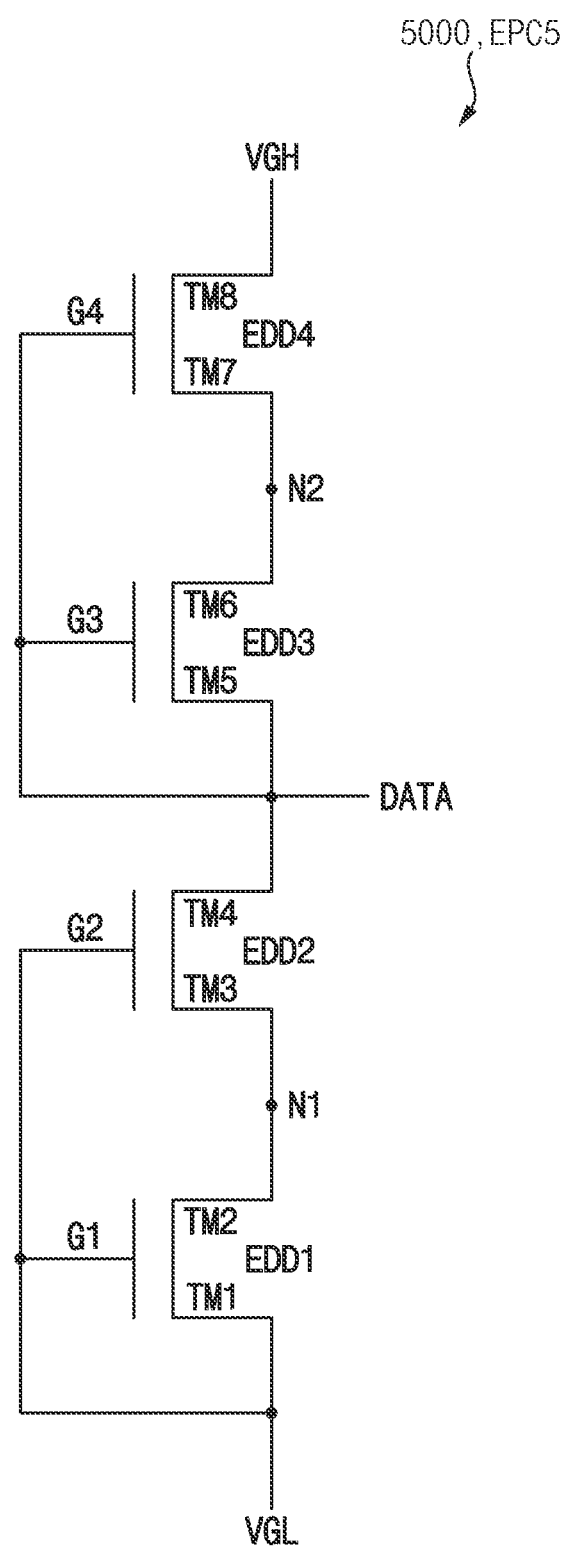
FIG. 11 is a circuit diagram illustrating an electrostatic protection circuit included in a display device according to still one or more other embodiments.

FIG. 11 is a circuit diagram illustrating an electrostatic protection circuit included in a display device according to one or more other embodiments.

Referring to FIG. 11, a display device 5000 according to still one or more other embodiments may include an electrostatic protection circuit EPC5. However, the display device 5000 may be substantially the same as the display device 1000, except for the electrostatic protection circuit EPC5.

The electrostatic protection circuit EPC5 may include a first electrostatic dual diode EDD1, a second electrostatic dual diode EDD2, a third electrostatic dual diode EDD3, and a fourth electrostatic dual diode EDD4.

The first electrostatic dual diode EDD1 may include a first gate terminal G1, a first terminal TM1, and a second terminal TM2. The first gate terminal G1 may be connected to the first gate driving voltage VGL. The first terminal TM1 may be connected to the first gate driving voltage VGL. The second terminal TM2 may be connected to a first node N1.

The second electrostatic dual diode EDD2 may include a second gate terminal G2, a third terminal TM3, and a fourth terminal TM4. The second gate terminal G2 may be connected to the first gate driving voltage VGL. The third terminal TM3 may be connected to the first node N1. The fourth terminal TM4 may be connected to the data voltage DATA.

The third electrostatic dual diode EDD3 may include a third gate terminal G3, a fifth terminal TM5, and a sixth terminal TM6. The third gate terminal G3 may be connected to the data voltage DATA. The fifth terminal TM5 may be connected to the data voltage DATA. The sixth terminal TM6 may be connected to the second node N2.

The fourth electrostatic dual diode EDD4 may include a fourth gate terminal G4, a seventh terminal TM7, and an eighth terminal TM8. The fourth gate terminal G4 may be connected to the data voltage DATA. The seventh terminal TM7 may be connected to the second node N2. The eighth terminal TM8 may be connected to the second gate driving voltage VGH.

In one or more embodiments, the second terminal TM2 and the third terminal TM3 may be directly connected to each other, the fourth terminal TM4 and the fifth terminal TM5 may be directly connected to each other, and the sixth terminal TM6 and the seventh terminal TM7 may be directly connected to each other.

In the display device 5000, as the first and second electrostatic dual diodes EDD1, EDD2 are implemented as dual, and the third and fourth electrostatic dual diodes EDD3, EDD4 are implemented as dual, current leakage by the electrostatic protection circuit EPC5 may be reduced or prevented.

Figure 12:
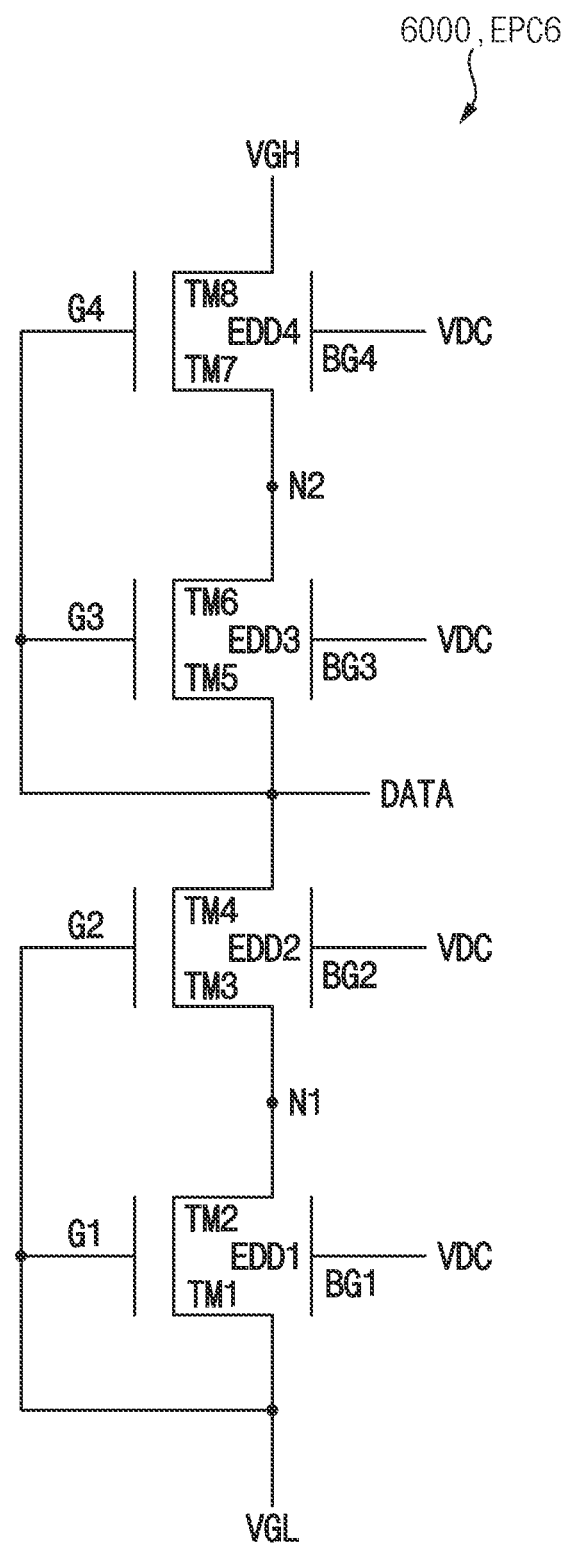
FIG. 12 is a circuit diagram illustrating an electrostatic protection circuit included in a display device according to still one or more other embodiments.

FIG. 12 is a circuit diagram illustrating an electrostatic protection circuit included in a display device according to still one or more other embodiments.

Referring to FIG. 12, a display device 6000 according to still one or more other embodiments may include an electrostatic protection circuit EPC6. However, the display device 6000 may be substantially the same as the display device 1000, except for the electrostatic protection circuit EPC6.

The electrostatic protection circuit EPC6 may include a first electrostatic dual diode EDD1, a second electrostatic dual diode EDD2, a third electrostatic dual diode EDD3, and a fourth electrostatic dual diode EDD4.

The first electrostatic dual diode EDD1 may include a first gate terminal G1, a first terminal TM1, a second terminal TM2, and a first lower gate terminal BG1. The first gate terminal G1 may be connected to the first gate driving voltage VGL. The first terminal TM1 may be connected to the first gate driving voltage VGL. The second terminal TM2 may be connected to a first node N1. The first lower gate terminal BG1 may be connected to the lower bias voltage VDC.

The second electrostatic dual diode EDD2 may include a second gate terminal G2, a third terminal TM3, a fourth terminal TM4, and a second lower gate terminal BG2. The second gate terminal G2 may be connected to the first gate driving voltage VGL. The third terminal TM3 may be connected to the first node N1. The fourth terminal TM4 may be connected to the data voltage DATA. The second lower gate terminal BG2 may be connected to the lower bias voltage VDC.

The third electrostatic dual diode EDD3 may include a third gate terminal G3, a fifth terminal TM5, a sixth terminal TM6, and a third lower gate terminal BG3. The third gate terminal G3 may be connected to the data voltage DATA. The fifth terminal TM5 may be connected to the data voltage DATA. The sixth terminal TM6 may be connected to the second node N2. The third lower gate terminal BG3 may be connected to the lower bias voltage VDC.

The fourth electrostatic dual diode EDD4 may include a fourth gate terminal G4, a seventh terminal TM7, an eighth terminal TM8, and a fourth lower gate terminal BG4. The fourth gate terminal G4 may be connected to the data voltage DATA. The seventh terminal TM7 may be connected to the second node N2. The eighth terminal TM8 may be connected to the second gate driving voltage VGH. The fourth lower gate terminal BG4 may be connected to the lower bias voltage VDC.

In one or more embodiments, the second terminal TM2 and the third terminal TM3 may be directly connected to each other, the fourth terminal TM4 and the fifth terminal TM5 may be directly connected to each other, and the sixth terminal TM6 and the seventh terminal TM7 may be directly connected to each other.

In the display device 6000, as the first and second electrostatic dual diodes EDD1, EDD2 are implemented as dual, the third and fourth electrostatic dual diodes EDD3, EDD4 are implemented as dual, and the lower bias voltage VDC, which is a constant voltage having a negative polarity is provided to the lower gate electrode, current leakage by the electrostatic protection circuit EPC6 may be reduced or prevented.

The present disclosure should not be construed as being limited to the embodiments set forth herein. Rather, these embodiments are provided so that this disclosure will be thorough and complete and will fully convey the concept of the present disclosure to those skilled in the art.

While the present disclosure has been particularly shown and described with reference to embodiments thereof, it will be understood by those of ordinary skill in the art that various changes in form and details may be made therein without departing from the spirit or scope of the present disclosure as defined by the following claims, with functional equivalents thereof to be include therein.

What is claimed is:

1. A display device comprising:
    a gate driver configured to receive a first gate driving voltage, configured to receive a second gate driving voltage that is greater than the first gate driving voltage, and configured to transmit a gate signal to a pixel;
    a data driver configured to transmit a data voltage to the pixel; and
    an electrostatic protection circuit configured to receive the first gate driving voltage and the data voltage, and comprising a first electrostatic diode comprising:
        a first gate terminal connected to the first gate driving voltage;
        a first terminal connected to the first gate driving voltage;
        a second terminal connected to the data voltage; and
        a first lower gate terminal connected to a lower bias voltage.

2. The display device of claim 1, wherein the lower bias voltage comprises a constant voltage having a negative polarity.

3. The display device of claim 1, wherein the lower bias voltage comprises the first gate driving voltage.

4. The display device of claim 1, wherein the electrostatic protection circuit is further configured to receive the second gate driving voltage, and further comprises a second electrostatic diode comprising:
- a second gate terminal connected to the data voltage;
- a third terminal connected to the data voltage;
- a fourth terminal connected to the second gate driving voltage; and
- a second lower gate terminal connected to the lower bias voltage.

5. The display device of claim 4, wherein the second terminal and the third terminal are directly connected to each other.

6. The display device of claim 4, wherein the lower bias voltage comprises a constant voltage having a negative polarity.

7. The display device of claim 4, wherein the lower bias voltage comprises the first gate driving voltage.

8. The display device of claim 1, wherein the electrostatic protection circuit is positioned between the pixel and the data driver.

* * * * *